United States Patent [19]

Yamada et al.

[11] Patent Number: 5,694,184
[45] Date of Patent: Dec. 2, 1997

[54] LIQUID CRYSTAL DISPLAY DEVICE

[75] Inventors: Keisaku Yamada, Ebina; Masami Kakinoki, Yokohama, both of Japan

[73] Assignee: Kabushiki Kaisha Toshiba, Kawasaki, Japan

[21] Appl. No.: 689,147

[22] Filed: Jul. 30, 1996

[30] Foreign Application Priority Data

Aug. 1, 1995 [JP] Japan .................... 7-196846

[51] Int. Cl.$^6$ .................... G02F 1/136; G02F 1/1333
[52] U.S. Cl. .................... 349/43; 349/138; 257/72
[58] Field of Search .................... 349/42, 43, 140, 349/138; 257/72

[56] References Cited

U.S. PATENT DOCUMENTS

| | | | |
|---|---|---|---|
| 5,081,515 | 1/1992 | Murata et al. | 257/758 |
| 5,233,211 | 8/1993 | Hayashi et al. | 349/140 |
| 5,296,653 | 3/1994 | Kiyota et al. | 174/250 |
| 5,376,222 | 12/1994 | Miyajima et al. | 216/88 |
| 5,414,278 | 5/1995 | Kobayashi et al. | 349/43 |
| 5,463,245 | 10/1995 | Hiruta | 257/620 |
| 5,508,532 | 4/1996 | Teramoto | 349/43 |
| 5,523,865 | 6/1996 | Furuta et al. | 349/138 |
| 5,526,304 | 6/1996 | Kawamura | 365/154 |
| 5,530,266 | 6/1996 | Yonehara et al. | 349/43 |
| 5,536,950 | 7/1996 | Liu et al. | 349/149 |

*Primary Examiner*—William L. Sikes
*Assistant Examiner*—Tiep H. Nguyen
*Attorney, Agent, or Firm*—Cushman, Darby & Cushman IP Group of Pillsbury Madison & Sutro LLP

[57] ABSTRACT

A liquid crystal display device including, a first substrate, a second substrate spaced apart from and facing to the first substrate, and provided with a counter electrode, and a liquid crystal composition layer hermetically filled in between the first substrate and the second substrate, wherein a switching element and a transparent pixel electrode connected to the switching element are formed on the first substrate, and the switching element comprises an active layer formed of either polycrystalline silicon or amorphous silicon, an insulating layer containing silicon which is formed on the active layer and provided with an opening, and a wiring electrically connected via the opening with the active layer and formed the insulating layer. The wiring is formed of an alloy comprising 0.1 to 10 mol % of a metal which is capable of reducing the insulating layer containing silicon and 90 mol % or more of copper.

27 Claims, 3 Drawing Sheets

LIQUID CRYSTAL DISPLAY DEVICE

BACKGROUND OF THE INVENTION

1. Field of the Invention

This invention relates to a liquid crystal display device, and in particular to a liquid crystal display provided with a wiring layer (or interconnecting wiring layer) which is excellent for electrical contact with a polycrystalline Si layer or an amorphous Si layer constituting a pixel switching element.

2. Description of the Related Art

Conventionally, a refractory metal such as molybdenum, a molybdenum alloy or an aluminum alloy has been extensively employed as a wiring to be connected with a pixel switching element in an active matrix type liquid crystal display device.

However, there is a problem in the employment of a refractory metal or the alloy thereof that the adhesivity of the refractory metal or the alloy thereof to an insulating film becomes poor if the insulating film contains Si as a constituent element. This can be mostly attributed to the fact that the refractory metal is incapable of reducing a Si oxide to Si.

There is another problem that when an opening for forming a contact hole is formed in an insulating interlayer, thus exposing the surface of an active layer, i.e., the surface of a monocrystalline Si layer, the surface of a polycrystalline Si layer or the surface of an amorphous Si layer, a natural Si oxide is inevitably formed under natural conditions on the exposed surface, so that a contact failure, e.g. an increase in electric contact resistance or an imperfect electrical contact at the surface will become a problem.

Moreover, there is a general trend to enlarge the size of the display screen and to further refine the pixels in an active matrix type liquid crystal display device. Accordingly, each line in the wiring of various kinds such as a scanning line or a signal line is now required to be increasingly long and fine. Therefore, the aspect ratios in both plane-wise and section-wise of various wirings such as a scanning line or a signal line are getting higher, thus making the scanning line or the signal line susceptible as a whole to peel-off. Further, since there is a trend to enlarge the size of display screen in an active matrix type liquid crystal display device, requiring each line in the wiring such as a scanning line or a signal line is to be increasingly long and fine as explained above, the attenuation of the scanning pulse or signal pulse being fed to these wirings is becoming a serious problem.

In the case of aluminum, which is employed conventionally as an electrode or wiring material in general, problems of poor adhesion and contact failure are rather negligible compared with the case where copper material is employed.

However, since the electric resistance of aluminum is apparently higher than copper, the aforementioned problem of attenuation of signal pulse can hardly be expected to be solved by using aluminum. Further, using of aluminum creates another problem in that there is a high possibility of breaking the wiring due to an electromigration effect caused by a high current density.

By contrast, copper is preferable because of its low electric resistance, but is accompanied with a drawback of poor oxidation resistance. A Cu wiring is already employed in a Si-based integrated circuit including an LSI device, and since Cu is low in electric resistivity and excellent in electromigration resistance, the application of Cu wiring to a ULSI device is now studied. However, since the Cu wiring is commonly applied to a first layer of multilayer wiring and then ultimately connected with al wiring, there is no possibility that the Cu wiring might be exposed to the outer atmosphere.

If a Cu wiring is to be applied to a liquid crystal display device however, the Cu wiring would not be connected, in view of saving manufacturing cost, to an al wiring which is relatively excellent in corrosion resistance, but would be used as a final wiring as it is. Furthermore, since an insulating film to be deposited on a Cu wiring would be poor in film quality due to a restricted range of film-forming temperature, the underlying wiring may be corroded through the overlying poor quality insulating film. In particular, there is also a problem that the Cu wiring is more susceptible to corrosion by to an aqueous solution containing hydrochloric acid which is an etchant for a transparent electrode.

As explained above, the technique of forming a wiring in an active matrix type liquid crystal display device is accompanied with problems to be solved, which are peculiar to the display device and are quite different from the technique of forming a wiring in a semiconductor element such as an LSI device.

SUMMARY OF THE INVENTION

Therefore, an object of this invention is to provide a liquid crystal display device provided with a wiring (or interconnecting wiring) which is excellent for electrical contact with a polycrystalline Si layer or an amorphous Si layer constituting a pixel switching element, and in adhesion.

Namely, according to the present invention, there is provided a liquid crystal display device comprising;

a first substrate;

a second substrate spaced apart from and facing to the first substrate, and provided with a counter electrode; and a liquid crystal composition layer hermetically filled in between the first substrate and the second substrate;

wherein a switching element and a transparent pixel electrode connected to the switching element are formed on the first substrate; and the switching element comprises an active layer formed of either polycrystalline silicon or amorphous silicon, an insulating layer containing silicon which is formed on the active layer and provided with an opening, and a wiring electrically connected via the opening with the active layer and formed the insulating layer; the wiring being formed of an alloy comprising 0.1 to 10 mol % of a metal and 90 mol % or more of copper.

According to the present invention, there is further provided a wiring structure formed on an active layer formed of either polycrystalline silicon or amorphous silicon with an insulating layer containing silicon and provided with an opening being interposed between the active layer and the insulating layer; the wiring structure being electrically contacted with the active layer via the opening; wherein the wiring structure comprises an alloy layer composed of 0.1 to 10 mol % of a metal and 90 mol % or more of copper, and a metal fluoride layer formed on the alloy layer which is capable of reducing the insulating layer from a silicon compound to pure silicon.

According to the present invention, there is further provided a method of manufacturing a liquid crystal display device comprising the steps of;

forming an active layer of a switching element on a transparent substrate, the active layer being formed of either polycrystalline silicon or amorphous silicon;

forming an insulating layer containing silicon on the active layer, the insulating layer being provided with an opening;

forming an alloy layer on the insulating layer, the alloy layer comprising 0.1 to 10 mol % of a metal and 90 to 99.9 mol % of copper;

forming a metal fluoride layer on a surface of the alloy layer by treating the surface of the alloy layer with a treating agent containing fluorine; and patterning the alloy layer to form a wiring which is electrically contacted with the active layer via the opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
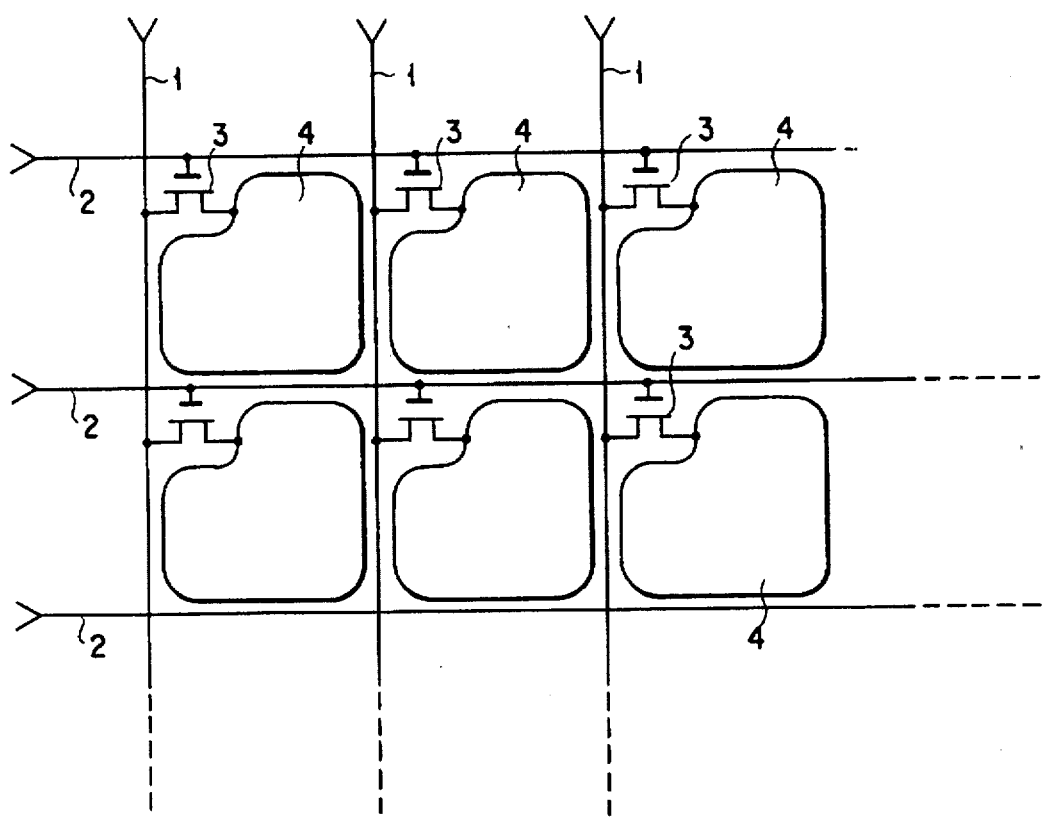
FIG. 1 is a plan view schematically illustrating a pixel portion of an active matrix type liquid crystal display device according to one embodiment of this invention.

The liquid crystal display device of this invention is featured in that the wiring which is formed on an amorphous silicon layer with an insulating layer being interposed therebetween and is electrically contacted with the amorphous silicon layer via an opening formed in the insulating layer is constituted by an alloy comprising 0.1 to 10 mol %, preferably 0.1 to 5 mol % of a metal capable of chemically reducing the insulating layer containing silicon and 90 to 99.9 mol %, preferably 95 to 99.9 mol % or more of copper.

As for the metal which is capable of chemically reducing the insulating layer containing silicon as a constituting element, it may be selected from Mg, Ca, Ti, Hf, V, Nb, Ta, Ni, Pd, Pt, Au, Cd, B, Al, In, Si, Ge, Pb, P, Sb, Bi, Se and Te. Among these metals, Mg, Ca, and al are preferable, and the most preferable metal is Mg.

The principal mechanism of this invention will be explained taking Mg as an example in the followings.

Mg exhibits a strong reducibility to $SiO_2$, and the change in free energy of MgO is smaller than that of $SiO_2$, which is a typical oxide material of Si. Therefore, the magnesium contained in copper can be easily reacted with the natural oxide film of Si.

Further, the wiring according to this invention reacts at the surfaces thereof with an underlying layer being formed beneath the wiring or with an insulating film containing Si and formed over the wiring.

Owing to these effects, it has become possible according to this invention to realize a liquid crystal display device provided with a wiring which is capable of overcoming the problems that have been often experienced in the prior art where pure copper is employed as a metal material for wiring, e.g. the problem of electric contact, the problem of adhesion or the problem of peel-off.

Furthermore, magnesium exhibits a higher oxidation property than copper, so that it can be selectively oxidized even in a dry air atmosphere, thereby forming a stable protecting film at the surface thereof, thus preventing any further oxidation of magnesium.

The copper material containing magnesium is featured in that when the copper material is immersed into a diluted hydrofluoric acid, the surface thereof is turned into a stable MgF. Copper per se also reacts with hydrofluoric acid to form a fluoride, which is soluble to hydrofluoric acid so that the copper material is ultimately covered with MgF. This MgF is very stable and useful as a reflection-preventing film which is applicable to a lens for an optical device, for example. The quality improvement derived from the generation of this protecting film ensures alignment in the processing with the indium-tin oxide in the manufacture of a liquid crystal display device. Namely, this invention is based on the effective utilization of these effects derived from the formation of MgF.

This MgF may also be formed not only through treatment with a diluted hydrofluoric acid, but also through a plasma treatment using a fluorine gas or a fluorine compound gas. The employment of plasma treatment may be useful where a material such as $SiO_2$, which is to be etched with hydrofluoric acid, coexists with a Cu—Mg alloy on a substrate since the treatment with hydrofluoric acid can not be employed in such a case. However, it is impossible in the case of plasma treatment to carry out a selective etching of Cu from the surface of Cu layer in contrast to the treatment using an etching solution. If a stronger MgF film is to be formed, Mg must be increased in concentration in a Cu material.

When the content of magnesium in the Cu material exceeds over 10 mol %, $MgCu_2$ may be precipitated in the Cu material. It has been found through experiments by the present inventors that the precipitation of this $MgCu_2$ is disadvantageous in terms of workability and electric properties. Therefore, the content of magnesium should preferably be not more than 10 mol %. On the other hand, if the content of magnesium is less than 0.1 mol %, reducibility of an alloy is lowered and a sufficient effect of this invention can not be obtained. Therefore, the content of magnesium should preferably be in the range of 0.1 to 10 mol %, and hence the resultant copper alloy contains 90 to 99.9 mol % of copper.

The value of 0.1 mol % in the content of magnesium is a minimum limit required to attain an electric improvement as explained hereinafter. On the other hand, the value of 10 mol % is an upper limit for ensuring the workability. As far as an equilibrium diagram is concerned, if the content of magnesium exceeds 5 mol %, an intermetallic compound of $MgCu_2$ will be precipitated in the Cu material. An acidic etching solution is generally employed in the working of a copper alloy. However, if such an acidic etching solution is employed for etching a Cu material containing $MgCu_2$, a difference in etching rate between this precipitated material of $MgCu_2$ and Cu containing Mg becomes prominent, so that a flat and smooth working of Cu material can no longer be achieved, thus giving a bad influence to the electric properties of the resultant Cu layer.

It should be noted that a sputter deposition is not governed by the equilibrium diagram. According to the experiments performed by the present inventors, the precipitation of $MgCu_2$ was not recognized if the content of Mg is 10 mol % or less, provided the heat treatment after deposition is carried out by controlling the temperature to 400° C. or lower and the treating time to 2 to 3 hours.

When a dry etching is employed for the working of the Cu—Mg alloy, $MgCu_2$ may be left as a working residue. Therefore, taking the workability of the alloy into consideration, the composition of Cu—Mg alloy should desirably be confined to a concentration region where the α-phase, i.e. a homogeneous phase in the metallic phase diagram can be maintained.

Specific examples of this invention will be further explained with reference to drawings.

Figure 2:
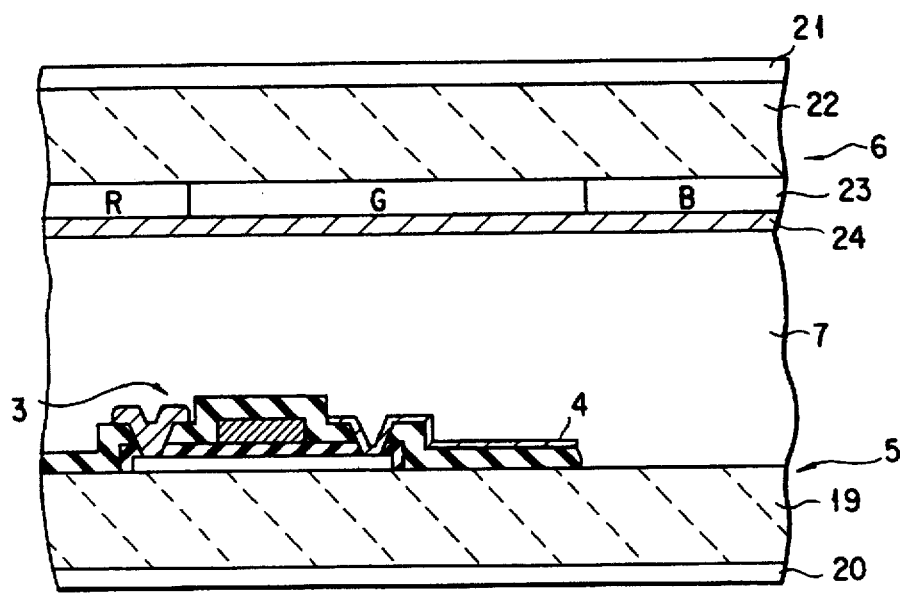
FIG. 2 is a cross-sectional view of an active matrix type liquid crystal display device according to one embodiment of this invention.

For a liquid crystal display device provided with a so-called active matrix type electrode structure, the structure schematically shown in FIGS. 1 and 2 wherein thin film transistors were mounted as a switching element comprising polycrystalline silicon (poly-Si) at each intersection of a matrix wiring was employed. Namely, FIG. 1 shows a plan view schematically illustrating the display pixel portion of a display pixel electrode array substrate and FIG. 2 shows a sectional view schematically showing a liquid crystal display device.

As shown in FIG. 1, a plurality of parallel signal lines 1 and a plurality of scanning lines 2 perpendicularly crossing these signal lines 1 are arranged in a matrix pattern, and a thin film transistor (TFT) is disposed as a switching element at each intersection of the signal lines 1 and the scanning lines 2. The drain electrode of TFT 3 is connected to the signal line 1, and the gate electrode is connected to the scanning line 2. The source electrode of the TFT 3 is connected to a display pixel electrode 4 comprising for example indium-tin oxide (ITO).

The liquid crystal display device provided with electric connections as shown in FIG. 1 is constructed as shown for example in FIG. 2. Namely, in the liquid crystal display device shown in FIG. 2, a display pixel electrode array substrate 5 is disposed to face a counter substrate 6 in parallel with each other, and a liquid crystal layer 7 functioning as an electric/light modulation substance is sandwiched between the display pixel electrode array substrate 5 and the counter substrate 6.

The display pixel electrode array substrate 5 is provided with an insulating substrate 19 made of a glass or plastics. Further, the insulating substrate 19 is provided on its one main surface with signal lines (not shown), scanning lines (not shown), TFT 3 and the display pixel electrode 4. On the other main surface of the insulating substrate 19 is mounted a deflecting plate 30.

On the other hand, the counter substrate 6 is provided with an insulating substrate 22 made of a glass or plastics. Further, this insulating substrate 22 is provided on its one main surface with a color filter 23 comprising red (R), green (G) and blue (B). On this color filter 23 is disposed a counter electrode 24. On the other main surface of the insulating substrate 22 is mounted a deflecting plate 21.

Figure 3:
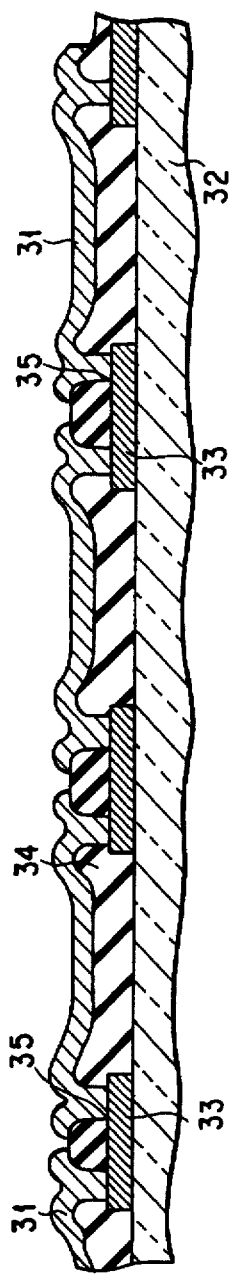
FIG. 3 is a cross-sectional view of a pixel switching element portion of a liquid crystal display device as a test sample.

FIG. 3 illustrates a cross-sectional view of a pixel switching element of a liquid crystal display device according to one embodiment of this invention, which has been prepared as a test sample. In FIG. 3, the wiring layer 31 was prepared as follows. Namely, three kinds of copper materials, each differing in the content of magnesium but falling within the range as defined by this invention (Mg: 0.1%, 0.5% and 4%), were prepared by mixing the component powders, and then each mixture was hot-pressed to form a target, which was then sputtered to form a layer on the substrate, which was then patterned using a photolithographic method.

The reference numeral 32 in FIG. 3 represents an insulating substrate such as a glass substrate, on which an n-type polycrystalline Si is formed. This n-type polycrystalline Si is subsequently worked into an island shape thereby forming an active layer 33. Thereafter, a silicon oxide film insulating layer 34 is deposited by way of chemical vapor deposition, and a contact hole 35 is formed in the silicon oxide film 34 using a photolithographic method. The aforementioned wiring layer 31 is then formed covering the contact hole 35. The contact hole 35 is square in planar shape and the length of one side is varied to form three samples differing in size, i.e. 1 μm, 2 μm and 10 μm.

Figure 4A:
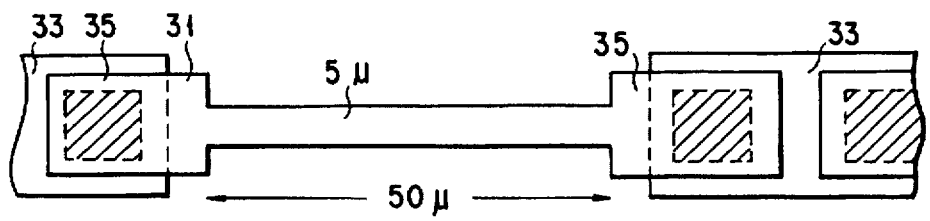
FIGS. 4A and 4B are plan views of a pixel switching element portion of a liquid crystal display device as a test sample.
Figure 4B:
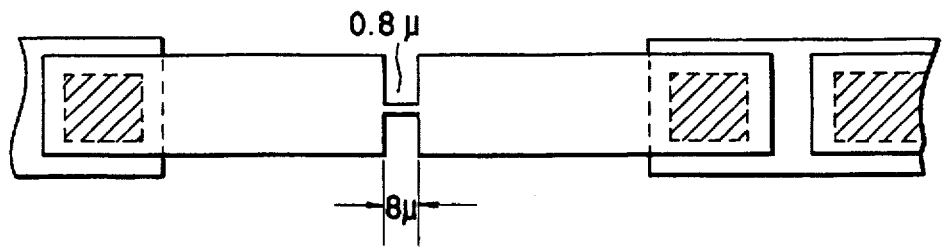

FIGS. 4A and 4B are plan views, each showing a pixel switching element of a liquid crystal display device shown in FIG. 3. As shown in these FIGS. 4A and 4B, two kinds of metallic wiring layers differing in planar shape are prepared and subjected to the following experiment. By the way, devices shown in FIGS. 4A and 4B are so designed that the resistances of both metallic wirings are theoretically identical with each other. However, FIGS. 4A and 4B are schematical views so that the scales of both FIGS. 4A and 4B are not accurate except for the main portions where the dimensions are indicated.

Figure 5:
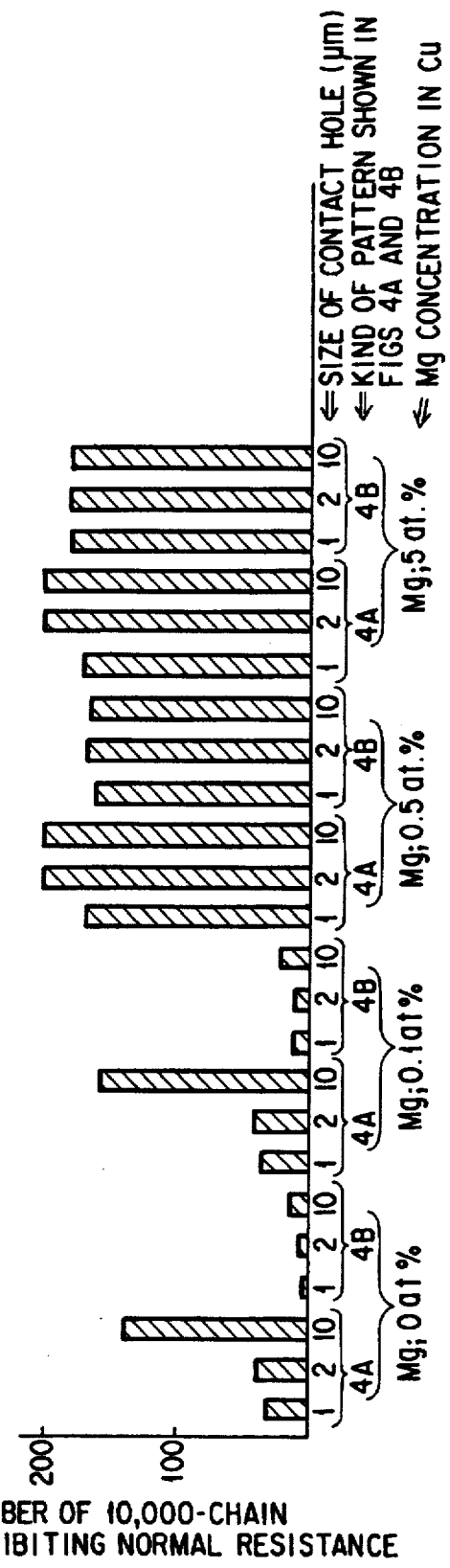
FIG. 5 is a graph showing the results of experiment of current passing test.

FIG. 5 illustrates the results of the current passing test which was performed on each of the test samples of pixel switching elements constructed as shown in FIGS. 3, 4A and 4B. Namely, the number of wirings indicated the normal current passage out of 200 lines of wirings, each wiring consisting of 10,000 chains connecting 20,000 contact holes, is indicated as a graph in FIG. 5. It is needless to say that, in the actual display device, many more contact holes and wirings are mounted on a substrate so that much more excellent result than that obtained in this experiment would be required. It should be noted that the shape of pattern of each test sample is so designed that as long as the size of contact hole is the same, there would be little difference in resistance of the chain as a whole between the patterns shown in FIGS. 4A and 4B.

It can be understood from the results of test shown in FIG. 5 that as the Mg concentration is increased, the ratio of normal wiring is also increased in any case regardless of the size of contact hole and the shape of pattern.

Taking notice of one example of Mg concentration, e.g. 0.5%, there is recognized a difference in the number of normal wirings between the pattern shown in FIG. 4A and the pattern shown in FIG. 4B even if the size of contact hole is the same. Namely, the wiring having a larger central neck portion indicated a lower percentage of defects due to the peel-off of wiring or breaking of wiring as compared with the wiring having a smaller central neck portion. However, when the concentration of Mg is increased, this difference in relative defects due to the difference in shape is minimized, and when the Mg concentration is 5%, this minimizing effect becomes most prominent. As evident from these results, the addition of Mg is effective in improving the reliability of Cu wiring formed on a $SiO_2$ film.

Then, taking notice of another example of Mg concentration, e.g. 0.1 at. %, it can be recognized that as the size of the contact hole becomes smaller, the fraction percentage of defective wiring becomes higher under this condition. This can be ascribed to the presence of a natural oxide film which has been unavoidably formed on the contact hole so that the smaller the size of contact hole, the larger the influence of the oxide film. The addition of Mg according to this invention is also effective in minimizing this influence as would be apparent from the results shown in FIG. 4A which were obtained when the Mg concentration in the pattern was 0.5% or 5%. This is also true when the aforementioned comparison is made on the pattern shown in FIG. 4B.

As will be seen from the above explanations, the addition of Mg to Cu material is effective in improving not only the reliability of wiring formed on an insulating film but also the reliability of contact to a Si-based semiconductor.

While Cu can be dissolved into an acid solution, thus generating Cu ions, the MgF film, which can be formed on the surface of a Cu material containing Mg when the Cu material is treated in a hydrofluoric acid solution, is stable against hydrochloric acid to be employed as an etching solution for working ITO (a mixture of $SnO_2$ and $In_2O_3$) generally employed as a transparent electrode material, and hence the MgF film is preferable in terms of etching resistance.

Figure 6:
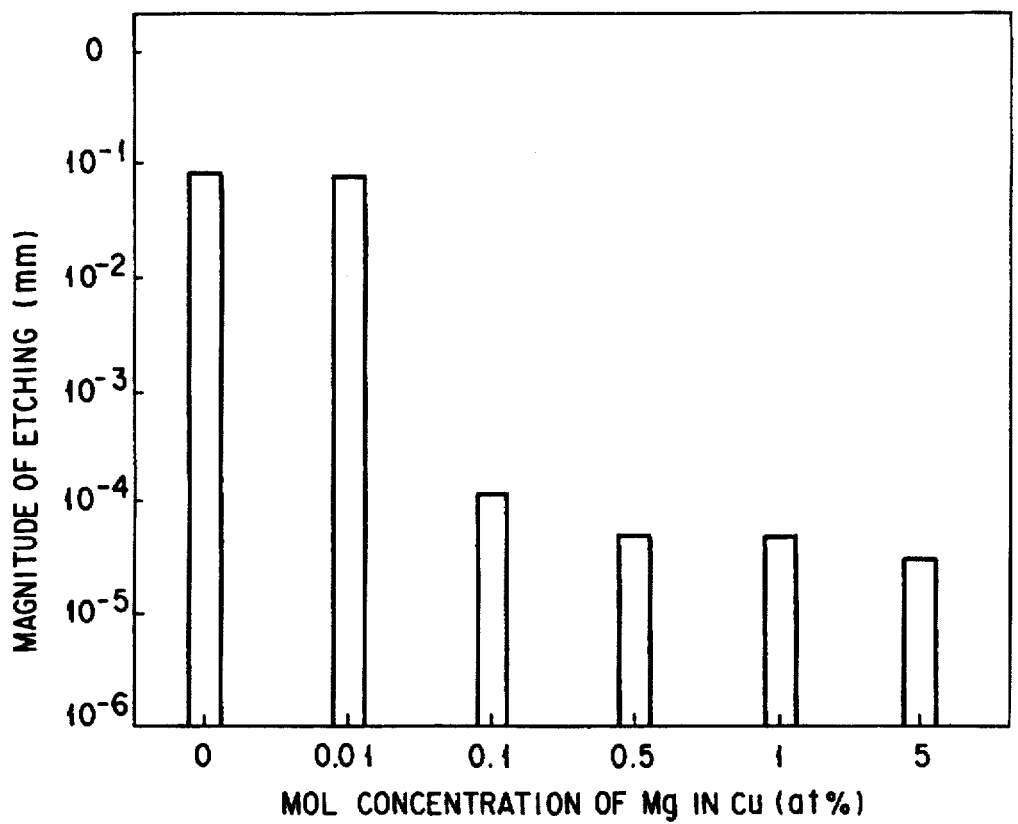
FIG. 6 is a graph showing a relationship between the Mg concentration in a copper alloy and the etching rate.

FIG. 6 is a graph showing a relationship between the Mg concentration in a copper alloy and the etching rate. The etching solution employed herein was composed of $HCl:H_2O$ (1:30 in molar ratio) and kept at a temperature of 18° C. The etching period of time was one minute. If the etching period of time is prolonged any further, the MgF film will be destroyed losing the effect thereof.

In the actual manufacturing process of a liquid crystal display device, there is no possibility that the Cu—Mg alloy wiring would be exposed and damaged by an ITO etching solution at the occasion of etching the ITO film. Namely, in the actual manufacturing process, the wiring is generally covered with $SiO_2$ film deposited by means of a CVD method. Therefore, the etching resistance of the wiring is not generally required except for a portion thereof which is coincident with the pin hole of $SiO_2$ film. In the case of this invention however, since the wiring has been subjected to a treatment to form a MgF film, the etching resistance of the wiring to an etchant through the pin hole can be greatly improved.

The Cu—Mg alloy of this invention is also effective where a dry etching is applied to the working of ITO film. Namely, in the ordinary process of manufacturing a TFT, the Cu—Mg wiring according to this invention is not exposed but is generally covered with an insulating interlayer during the dry etching step of ITO film. However, a portion of the Cu—Mg may happen to be exposed due to defectives of process or due to flaws that may be seen around the periphery of the substrate.

$CH_4$ or HI is generally employed as an etchant in the dry etching of ITO film, so that any exposed surface portion of Cu may be slightly etched by the plasma hydrogen to be generated at the occasion of dry etching. Although the etching per se may be negligible, it raises a problem of contaminating the etching chamber with Cu thus released. It is needless to say that Cu is one of the elements that should be eliminated by all means in a Si-based semiconductor device. Therefore, the contamination of an etching chamber with the accumulation of Cu should be avoided at any cost.

Whereas, in the case of this invention, MgO that will be inevitably formed on the surface of the Cu—Mg alloy is highly resistive to the hydrogen plasma sputtering, so that the contamination of the ITO etching chamber with Cu can be effectively avoided.

It may be conceivable to apply a Cu—Mg wiring to an LSI device. However, the demands to be required for preventing the peel-off of wiring in a liquid crystal display device differ from those required in an LSI device. Namely, in the case of an LSI device, the application of Cu-based wiring is confined to lower wirings in a multilayer wiring and aluminum is generally employed for the uppermost wiring layer as well as for the bonding pads. Therefore, if there is no possibility that the Cu-based wiring might be peeled off in the middle of manufacturing process of an LSI device, any trouble resulting from the poor adhesion of Cu-based wiring would not be raised in the subsequent manufacturing process of the LSI device.

In the case of a liquid crystal display device however, a Cu wiring is often left exposed even after the final manufacturing step. It is of course possible in a liquid crystal display device to adopt a multilayer structure of aluminum as in the case an LSI device. However, the employment of such a multilayer structure would give rise to an increase in manufacturing cost, thus making it difficult to adopt the multilayer structure. When a Cu wiring is left exposed as mentioned above, a TAB (Tape Automated Bonding) is then performed to the exposed Cu wiring and at the same time any trouble that might be caused from the peel-off of bonding is must to be eliminated. Whereas the Cu material containing Mg according to this invention is also effective in effectively minimizing any trouble resulting from the TAB, since the Cu—Mg wiring is capable of slightly reducing the underlying insulating film, thus enhancing the bonding strength thereof with the underlying insulating film.

Although magnesium was selected as a metal capable of reducing $SiO_2$ Si in the above example, it is also possible according to this invention to employ Ca, Ti, Hf, V, Nb, Ta, Ni, Pd, Pt, Au, Cd, B, Al, In, Si, Ge, Pb, P, Sb, Bi, Se and Te.

Among them, thorium may not be suited for use as a metallic material for a semiconductor, since a small quantity of radioactive material is included therein. On the other hand, zirconium and calcium are hardly soluble in copper. Namely, the α-phase region thereof in the metallic phase diagram is relatively narrow, so that an intermetallic compound may be readily formed by the addition of small amount of these metals, which is not desirable.

As explained above, it is possible according to this invention to ensure the reduction of the natural oxide film of copper alloy, thereby solving the problem to be encountered in the employment of a copper alloy which is desirable in terms of electric resistance. At the same time, it is possible to obtain a wiring which has excellent electric contact with polycrystalline silicon and amorphous silicon. Furthermore, it is possible to provide a wiring having an improved adhesion to a Si oxide film or a film containing Si oxide, which have been extensively employed as an insulating film in a semiconductor device. As a result, it is possible to provide a liquid crystal display device which is provided with a wiring which is capable of exhibiting an excellent electric contact to at least either the polycrystalline Si layer or the amorphous Si layer of a pixel switching element, and at the same time solving the problem of peel-off.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A liquid crystal display device comprising;

a first substrate;

a second substrate spaced apart from and facing said first substrate, and provided with a counter electrode; and a liquid crystal composition layer hermetically filled in between said first substrate and said second substrate;

wherein a switching element and a transparent pixel electrode connected to said switching element are formed on said first substrate, said switching element comprises an active layer formed of either one of polycrystalline silicon and amorphous silicon, an insulating layer containing silicon which is formed on said active layer and provided with an opening, and a wiring electrically connected via said opening formed in said insulating layer with said active layer, said wiring being formed of an alloy comprising 0.1 to 10 mol % of a metal and 90 mol % or more of copper.

2. The liquid crystal display device according to claim 1, wherein said wiring is formed of an alloy comprising 0.1 to 5 mol % of a metal and 95 to 99.9 mol % of copper.

3. The liquid crystal display device of claim 2 wherein said insulating layer containing silicon contains a silicon compound, and said metal in said wiring is capable of reducing the silicon compound.

4. The liquid crystal display device according to claim 1, wherein said metal is selected from the group consisting of Mg, Ca, Ti, Hf, V, Nb, Ta, Ni, Pd, Pt, Au, Cd, B, Al, In, Si, Ge, Pb, P, Sb, Bi, Se and Te.

5. The liquid crystal display device according to claim 1, wherein said metal is selected from the group consisting of Mg, Ca and Al.

6. The liquid crystal display device according to claim 1, wherein said metal is Mg.

7. The liquid crystal display device according to claim 1, wherein a metal fluoride is formed on a surface of said wiring layer.

8. The liquid crystal display device of claim 7 wherein said insulating layer containing silicon contains a silicon compound, and said metal fluoride is capable of reducing the silicon compound.

9. The liquid crystal display device according to claim 1, wherein said liquid crystal display device is an active matrix type liquid crystal display.

10. The liquid crystal display device of claim 1, wherein said insulating layer containing silicon contains a silicon compound, and said metal in said wiring is capable of reducing the silicon compound.

11. A wiring structure formed on an active layer formed of either one of polycrystalline silicon and amorphous silicon with an insulating layer containing silicon and provided with an opening being interposed between said active layer and said wiring structure, said wiring structure being electrically contacted with said active layer via said opening; wherein said wiring structure comprising:

an alloy layer composed of 0.1 to 10 mol % of a metal and 90 mol % or more of copper; and a metal fluoride layer formed on said alloy layer and capable of reducing said insulating layer.

12. The wiring structure according to claim 11, wherein said alloy layer is formed of an alloy comprising 0.1 to 5 mol % of a metal and 95 to 99.9 mol % of copper.

13. The wiring structure of claim 12, wherein the insulating layer containing silicon in the active layer contains a silicon compound, and said metal in said wiring structure is capable of reducing the silicon compound.

14. The wiring structure according to claim 11, wherein said metal is selected from the group consisting of Mg, Ca, Ti, Hf, V, Nb, Ta, Ni, Pd, Pt, Au, Cd, B, Al, In, Si, Ge, Pb, P, Sb, Bi, Se and Te.

15. The wiring structure according to claim 11, wherein said metal is selected from the group consisting of Mg, Ca and Al.

16. The wiring structure according to claim 11, wherein said metal is Mg.

17. The wiring structure of claim 11, wherein the insulating layer containing silicon in the active layer contains a silicon compound, and said metal in said wiring structure is capable of reducing the silicon compound.

18. A method of manufacturing a liquid crystal display device comprising the steps of:

forming an active layer of a switching element on a transparent substrate, said active layer being formed of either one of polycrystalline silicon and amorphous silicon;

forming an insulating layer containing silicon on said active layer, said insulating layer being provided with an opening;

forming an alloy layer on said insulating layer, said alloy layer comprising 0.1 to 10 mol % of a metal and 90 to 99.9 mol % of copper;

forming a metal fluoride layer on a surface of said alloy layer by treating the surface of said alloy layer with a treating agent containing fluorine; and patterning said alloy layer to form a wiring which is electrically contacted with said active layer via said opening.

19. The method of manufacturing a liquid crystal display device according to claim 18, wherein said step of forming the alloy layer is performed by way of sputtering.

20. The method of manufacturing a liquid crystal display device according to claim 18, wherein said surface treatment is performed by making use of a diluted hydrofluoric acid.

21. The method of manufacturing a liquid crystal display device according to claim 18, wherein said surface treatment is performed by making use of plasma containing fluorine.

22. The method of manufacturing a liquid crystal display device according to claim 18, wherein said alloy layer is formed of an alloy comprising 0.1 to 5 mol % of a metal and 95 to 99.9 mol % of copper.

23. The method of claim 22, wherein said step of forming an insulating layer forms an insulating layer containing a silicon compound, and said step of forming an alloy layer uses an alloy capable of reducing the silicon compound.

24. The method of manufacturing a liquid crystal display device according to claim 18, wherein said metal is selected from the group consisting of Mg, Ca, Ti, Hf, V, Nb, Ta, Ni, Pd, Pt, Au, Cd, B, Al, In, Si, Ge, Pb, P, Sb, Bi, Se and Te.

25. The method of manufacturing a liquid crystal display device according to claim 18, wherein said metal is selected from the group consisting of Mg, Ca and Al.

26. The method of manufacturing a liquid crystal display device according to claim 18, wherein said metal is Mg.

27. The method of claim 18, wherein said step of forming an insulating layer forms an insulating layer containing a silicon compound, and said step of forming an alloy layer uses an alloy capable of reducing the silicon compound.

* * * * *